(12) United States Patent
Song et al.

(10) Patent No.: US 9,460,775 B1
(45) Date of Patent: Oct. 4, 2016

(54) SENSE AMPLIFIER DRIVING DEVICE AND SEMICONDUCTOR DEVICE INCLUDING THE SAME

(71) Applicant: SK hynix Inc., Icheon-si Gueonggi-do (KR)

(72) Inventors: Jun Yong Song, Seoul (KR); Jong Ho Son, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/818,093

(22) Filed: Aug. 4, 2015

(30) Foreign Application Priority Data

Mar. 27, 2015 (KR) ........................ 10-2015-0043256

(51) Int. Cl.

| G11C 7/00 | (2006.01) |
|---|---|
| G11C 11/4091 | (2006.01) |
| G11C 11/4074 | (2006.01) |
| G11C 11/4076 | (2006.01) |
| G11C 11/4094 | (2006.01) |

(52) U.S. Cl.
CPC ........ G11C 11/4091 (2013.01); G11C 11/4074 (2013.01); G11C 11/4076 (2013.01); G11C 11/4094 (2013.01)

(58) Field of Classification Search
CPC ........ G11C 7/1006; G11C 7/14; G11C 7/062

USPC .................................... 365/189.07, 206, 207
See application file for complete search history.

(56) References Cited

U.S. PATENT DOCUMENTS

| 2008/0219073 A1* | 9/2008 | Kang ................. G11C 11/4091 365/210.12 |
| 2012/0275251 A1* | 11/2012 | Jin .......................... G11C 7/065 365/203 |

FOREIGN PATENT DOCUMENTS

| KR | 1020100001528 A | 1/2010 |
| KR | 1020110035748 A | 4/2011 |

* cited by examiner

*Primary Examiner* — Son Dinh

(74) *Attorney, Agent, or Firm* — William Park & Associates Ltd.

(57) ABSTRACT

A sense amplifier driving device may include a sense amplifier driving block configured to supply a post overdriving voltage to a pull-up power line coupled to a sense amplifier, the post overdriving voltage supplied to the sense amplifier during a post overdriving operation period in correspondence to a pull-up driving signal. The sense amplifier driving device may include a driving signal generation block configured to compare a reference voltage, set by a voltage trimming signal, with a level of a power supply voltage, and generate the pull-up driving signal for controlling whether to perform a post overdriving operation.

20 Claims, 9 Drawing Sheets

SENSE AMPLIFIER DRIVING DEVICE AND SEMICONDUCTOR DEVICE INCLUDING THE SAME

CROSS-REFERENCES TO RELATED APPLICATION

The present application claims priority under 35 U.S.C. §119(a) to Korean application number 10-2015-0043256, filed on Mar. 27, 2015, in the Korean Intellectual Property Office, which is incorporated herein by reference in its entirety.

BACKGROUND

1. Technical Field

Various embodiments generally relate to a sense amplifier driving device and a semiconductor device including the sense amplifier driving device. More particularly, various embodiments relate to a technology for improving the post overdriving operation characteristic of a semiconductor device.

2. Related Art

Semiconductor memory devices are being developed to increase the degree of integration and the operating speeds of the semiconductor memory devices. In order to increase the operating speeds of the semiconductor memory devices, a synchronous memory device has been developed. This synchronous memory device is capable of operating in synchronization with a clock signal. The clock signal is received by the synchronous memory device from outside a memory chip.

For example, an SDR (single data rate) synchronous memory device inputs and outputs data through a single data pin during a single clock cycle. In the SDR synchronous memory device, the input and output of the data is in synchronization with the rising edge of a clock signal.

However, the SDR synchronous memory device has difficulty in operating with systems requiring high speed operations. Accordingly, a DDR (double data rate) synchronous memory device consecutively inputs and outputs data through each data input/output pin, in synchronization with the rising edge and the falling edge of a clock signal.

As such, a bandwidth at least two times wider than the conventional SDR synchronous memory device is realized without increasing the frequency of a clock signal, and thus, a high speed operation may be achieved.

Among semiconductor memory devices, a DRAM (dynamic random access memory) is a representative volatile memory. The memory cell of the DRAM is constructed with a cell transistor and a cell capacitor.

The cell transistor functions to control an access to the cell capacitor. The cell capacitor stores charges corresponding to data. That is to say, according to the amount of the charges stored in the cell capacitor, data of a high level or data of a low level is determined.

If a word line is activated in a semiconductor memory device, charge sharing occurs between a bit line and a bit bar line, and then, a sense amplifier operates. The sense amplifier performs initially an overdriving operation by using an external voltage VDD for a predetermined pulse period, such that the bit line or the bit bar line may quickly reach a target voltage level.

In this regard, as the power supply voltage of a semiconductor memory device gradually decreases, a core voltage (VCORE) decreases as well. Due to this fact, as the amount of charges of the cell of a DRAM decreases, the refresh and tWR (a time during which a precharge command may be applied after a point of time at which a write command is applied) characteristics of the DRAM may deteriorate.

In order to cope with this problem, a post overdriving (POD) operation is performed. In a POD operation the charging voltage of the cell is momentarily increased during only the final part of a period in which charges are transferred to the cell. However, an external voltage may be a high voltage or a low voltage according to a system. Therefore, in the case where the POD operation is performed regardless of the level of a power supply voltage, an efficient sense operation may not be performed.

In other words, if a power supply voltage is high, as a pair of bit lines are excessively overshot, unnecessary current consumption is caused. Conversely, if the power supply voltage is low, the bit line or the bit bar line may not quickly reach the target voltage level, and thus, the stable speed of the semiconductor memory device may not be ensured.

SUMMARY

According to an embodiment, there may be provided a sense amplifier driving device. The sense amplifier driving device may include a sense amplifier driving block configured to supply a post overdriving voltage to a pull-up power line coupled to a sense amplifier, the post overdriving voltage supplied to the sense amplifier during a post overdriving operation period in correspondence to a pull-up driving signal. The sense amplifier driving device may include a driving signal generation block configured to compare a reference voltage, set by a voltage trimming signal, with a level of a power supply voltage, and generate the pull-up driving signal for controlling whether to perform a post overdriving operation.

According to an embodiment, there may be provided a semiconductor device. The semiconductor device may include a sense amplifier configured to sense and amplify data according to a voltage applied to a pull-up power line and a pull-down power line. The semiconductor device may include a sense amplifier driving device configured to compare a reference voltage, set by a voltage trimming signal, with a level of a power supply voltage. The sense amplifier driving device may be configured to generate a pull-up driving signal for controlling whether to perform a post overdriving operation. The sense amplifier driving device may be configured to selectively supply a post overdriving voltage to the pull-up power line during a post overdriving operation period in correspondence to the pull-up driving signal.

DETAILED DESCRIPTION

Hereinafter, a sense amplifier driving device and a semiconductor device including the same will be described below with reference to the accompanying drawings through various examples of embodiments.

Various embodiments may be directed to reducing unnecessary power consumption by controlling a post overdriving operation in correspondence to the level of a power supply voltage.

According to the various embodiments, by controlling a post overdriving operation in such a way as not to be performed in the case where the level of a power supply voltage is a high voltage level, advantages are provided in that a data retention time characteristic may be improved and unnecessary power consumption may be reduced.

Figure 1:
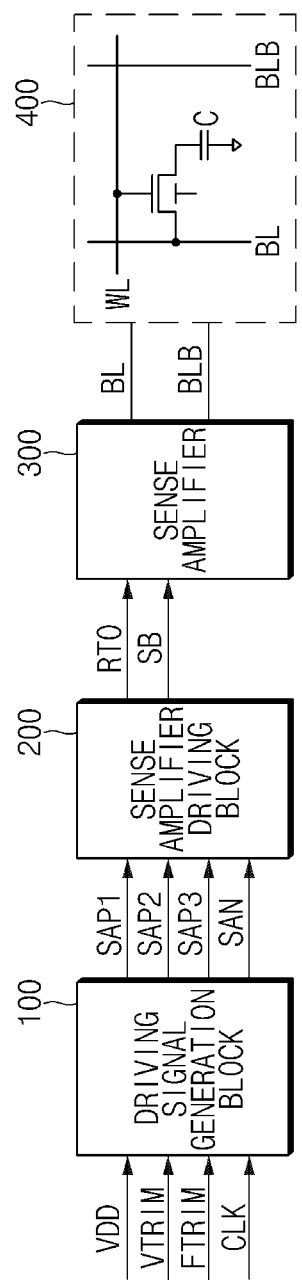
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

Data stored in the semiconductor device in accordance with an embodiment is identified as a high level (H) or a low level (L) in correspondence to a voltage level, and is expressed as '1' or '0'. A data value is differently identified according to a voltage level and a current magnitude. In the case of binary data, a high level is defined as a high voltage, and a low level is defined as a low voltage lower than the high level.

Referring to FIG. 1, the semiconductor device in accordance with an embodiment may include a driving signal generation block 100, a sense amplifier driving block 200, a sense amplifier 300, and a memory cell 400. In an embodiment, the driving signal generation block 100 and the sense amplifier driving block 200 may be collectively referred to as a "sense amplifier driving device".

The driving signal generation block 100 may generate a plurality of pull-up driving signals SAP1 to SAP3 and a pull-down driving signal SAN. The pull-up driving signals SAP1 to SAP3 and the pull-down driving signal SAN may be generated by the driving signal generation block 100 in correspondence to a power supply voltage VDD, a voltage trimming signal VTRIM, a frequency trimming signal FTRIM and a clock CLK. The plurality of pull-up driving signals SAP1 to SAP3 and the pull-down driving signal SAN may be enabled for respective predetermined periods, according to an active signal, a precharge signal, the power supply voltage VDD, the voltage trimming signal VTRIM, the frequency trimming signal FTRIM and the clock CLK. The active signal may be a signal enabled to a low level after a predetermined time from a point of time at which an active command is applied.

The sense amplifier driving block 200 supplies power to a pull-up power line RTO coupled with the sense amplifier 300, according to the pull-up driving signals SAP1, SAP2 and SAP3 and the pull-down driving signal SAN. The sense amplifier driving block 200 supplies power to a pull-down power line SB coupled with the sense amplifier 300, according to the pull-up driving signals SAP1, SAP2 and SAP3 and the pull-down driving signal SAN. The sense amplifier driving block 200 controls overdriving and post overdriving (POD) operations.

The sense amplifier driving block 200 drives the pull-up power line RTO to the levels of the power supply voltage VDD (a first pull-up voltage), a core voltage VCORE (a second pull-up voltage) and a post overdriving voltage VDD_POD (a third pull-up voltage) higher than the power supply voltage VDD, in response to the pull-up driving signals SAP1 to SAP3.

In an embodiment, the driving signal generation block 100 may selectively control whether to enable the pull-up driving signal SAP3 controlling the post overdriving voltage VDD_POD, in correspondence to the power supply voltage VDD. For example, the driving signal generation block 100 disables the pull-up driving signal SAP3 in the example where the power supply voltage VDD is as sufficiently high as a high voltage level, such that the post overdriving voltage VDD_POD is not supplied to the pull-up power line RTO.

The sense amplifier driving block 200 drives the pull-down power line SB to the level of a ground voltage VSS in response to the pull-down driving signal SAN. The sense amplifier driving block 200 precharges the pull-up power line RTO and the pull-down power line SB to the level of an equalizing voltage VBLEQ in response to a precharge signal BLEQ.

The sense amplifier 300 operates according to the driving power applied to the pull-up power line RTO and the pull-down power line SB. Such a sense amplifier 300 senses and amplifies the data applied from the memory cell 400 through a pair of bit lines BL and BLB, and outputs the amplified data to a sensing line.

The memory cell 400 may store the data applied from the pair of bit lines BL and BLB or output stored data to the sense amplifier 300 through the pair of bit lines BL and BLB, when a word line WL is enabled.

The unit cell of the memory cell 400 may include one switching element T and one capacitor C. The switching element T is coupled between the bit line BL and the capacitor C, and selectively performs a switching operation according to the word line WL. The capacitor C is coupled between a cell plate voltage terminal and the switching element T, and stores data. If the word line WL is enabled, the switching element T is turned on, and the data applied from the bit line BL is stored in the capacitor C.

In an embodiment having the above-described configuration, in an active mode, the core voltage VCORE is supplied to the pull-up power line RTO and the ground voltage VSS is supplied to the pull-down power line SB. Conversely, in an overdriving mode, the power supply voltage VDD higher than the core voltage VCORE is supplied to the pull-up power line RTO for a predetermined initial period. In a post overdriving mode, the post overdriving voltage VDD_POD higher than the power supply voltage VDD is supplied to the pull-up power line RTO for a predetermined last period.

In an embodiment, after the memory cell 400 is disabled in a precharge mode, the equalizing voltage VBLEQ with the level of a bit line precharge voltage is supplied to the pull-up power line RTO and the pull-down power line SB.

The semiconductor device in accordance with an embodiment may perform the overdriving operation during the development period of the pair of bit lines BL and BLB to increase a tRCD (a RAS to CAS delay time). In the semiconductor device in accordance with an embodiment, the sense amplifier driving device performs the post overdriving operation during a post overdriving period before the word line WL is disabled (before a point of time at which the memory cell 400 is disabled). The post overdriving period may be defined as a predetermined period before the word line WL of the memory cell 400 is disabled, before a precharge period.

For example, it is assumed that data of a high level is stored in the memory cell 400 and the sense amplifier 300 amplifies data of a high level and transfers the amplified data to the memory cell 400. The memory cell 400 is transferred with data by the post overdriving voltage VDD_POD with a level higher than the power supply voltage VDD and the ground voltage VSS, until immediately before it is disabled. Therefore, a data retention time in the state in which the memory cell 400 is disabled is increased.

In a write mode, the memory cell 400 is enabled, and write data is transferred to the pair of bit lines BL and BLB through the sensing line. The sense amplifier 300 senses and amplifies the write data of the pair of bit lines BL and BLB, and transfers the amplified write data to the memory cell 400.

For example, it is assumed that write data of a high level is transferred to the memory cell 400. The sense amplifier 300 transfers the write data to the memory cell 400 by the core voltage VCORE.

Thereafter, the memory cell 400 is transferred with data by the post overdriving voltage VDD_POD with the level higher than the power supply voltage VDD and the ground voltage VSS, until immediately before the memory cell 400 is disabled in the precharge mode. Due to this fact, a time tWR during which a precharge command may be applied after a point of time at which a write command is applied may be shortened. In particular, a time for retaining data with the memory cell 400 disabled is increased.

The fact that the memory cell 400 is enabled means that the cell transistor T is turned on by the control voltage transferred through the word line WL and the cell capacitor C and the positive bit line BL are electrically coupled. Also, the fact that the memory cell 400 is disabled means that the cell transistor T is turned off.

The semiconductor device may enter corresponding operation modes by the active command, the precharge command, write command, and so forth. In general, a corresponding operation mode is substantially entered after a predetermined time from a point of time at which a command signal is applied.

Further, in the semiconductor device, as the write command or a read command is applied between the active command and the precharge command, a data write operation or a data read operation may be performed.

Figure 2:
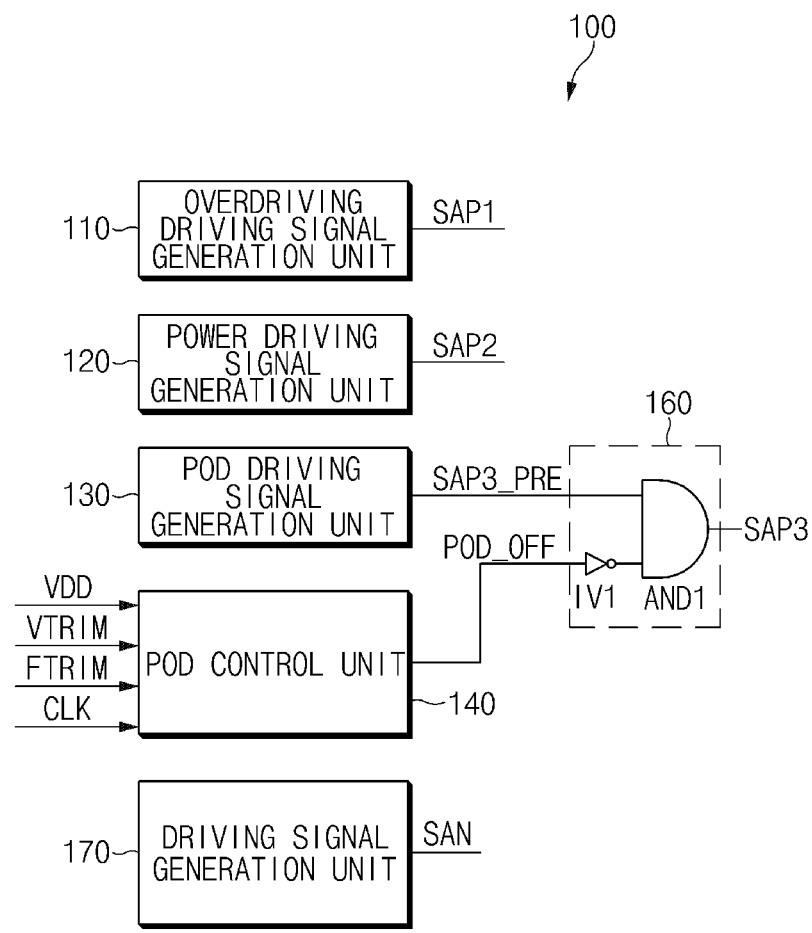
FIG. 2 is a circuit diagram illustrating a representation of an example of the driving signal generation block illustrated in FIG. 1.

FIG. 2 is a circuit diagram illustrating a representation of an example of the driving signal generation block 100 illustrated in FIG. 1.

The driving signal generation block 100 may include an overdriving driving signal generation unit 110, a power driving signal generation unit 120, and a post overdriving (POD) driving signal generation unit 130. The driving signal generation block 100 may include a POD control unit 140, a combination unit 160, and a driving signal generation unit 170.

The overdriving driving signal generation unit 110 may generate the pull-up driving signal SAP1 for controlling the overdriving operation, in correspondence to a sense amplifier active signal. The power driving signal generation unit 120 may generate the pull-up driving signal SAP2 for controlling a normal operation, in correspondence to the sense amplifier active signal. The POD driving signal generation unit 130 may generate a driving signal SAP3_PRE for controlling the post overdriving operation, in correspondence to the sense amplifier active signal. The driving signal generation unit 170 may generate the pull-down driving signal SAN for controlling the normal operation, in correspondence to the sense amplifier active signal.

The POD control unit 140 may output a POD control signal POD_OFF in correspondence to the power supply voltage VDD, the voltage trimming signal VTRIM, the frequency trimming signal FTRIM and the clock CLK. Such a POD control unit 140 senses the level of the power supply voltage VDD, and enables the POD control signal POD_OFF for interrupting the POD operation in the example of a high voltage level.

The combination unit 160 combines the driving signal SAP3_PRE and the POD control signal POD_OFF, and selectively enables the pull-up driving signal SAP3. The combination unit 160 disables the pull-up driving signal SAP3 in the example where at least any one of the driving signal SAP3_PRE and the inverted signal of the POD control signal POD_OFF is a low level.

Such a combination unit 160 may include, for example but not limited to, an inverter IV1 and an AND gate AND1. The AND gate AND1 performs an AND logic function on the driving signal SAP3_PRE and the inverted signal of the POD control signal POD_OFF. The inverted signal of the POD control signal POD_OFF is generated after the inverter IV1 receives the POD control signal POD_OFF, inverts the POD control signal POD_OFF, and outputs the inverted signal of the POD control signal POD_OFF.

Figure 3:
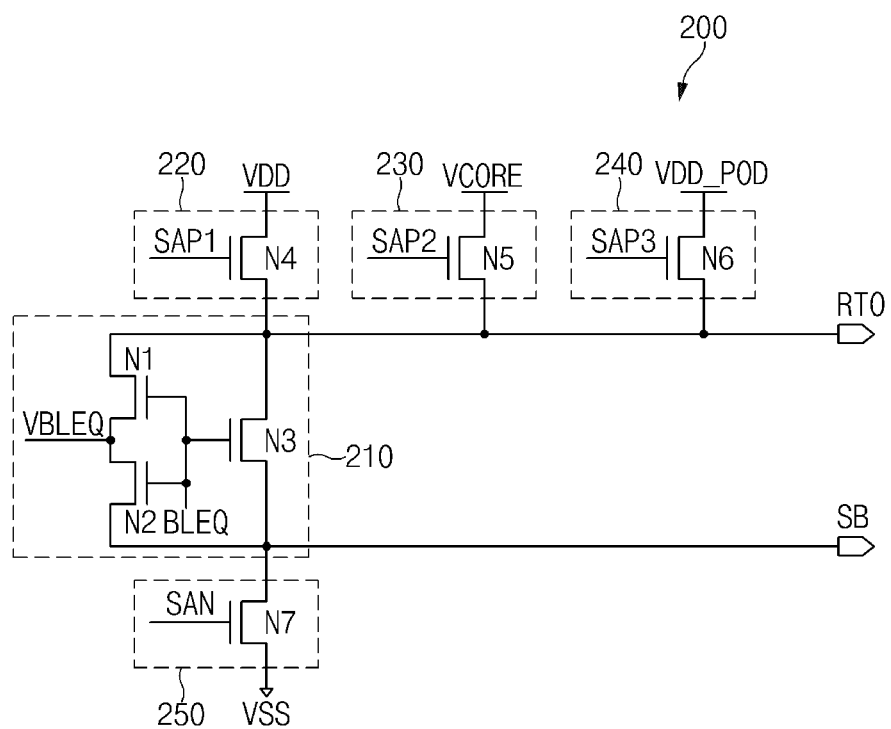
FIG. 3 is a circuit diagram illustrating a representation of an example of the sense amplifier driving block illustrated in FIG. 1.

FIG. 3 is a circuit diagram illustrating a representation of an example of the sense amplifier driving block 200 illustrated in FIG. 1.

The sense amplifier driving block 200 may include a precharge driving unit 210, pull-up driving units 220 to 240, and a pull-down driving unit 250.

The precharge driving unit 210 may supply the equalizing voltage VBLEQ to the pull-up power line RTO and the pull-down power line SB according to the precharge signal BLEQ while in the precharge mode. Such a precharge driving unit 210 may include, for example but not limited to, a plurality of NMOS transistors N1 to N3. The gate terminals of the NMOS transistors N1 to N3 may be coupled in common.

The NMOS transistor N1 may be coupled between the application terminal of the equalizing voltage VBLEQ and the pull-up power line RTO. The NMOS transistor N2 may be coupled between the application terminal of the equalizing voltage VBLEQ and the pull-down power line SB. The NMOS transistor N3 may be coupled between the pull-up power line RTO and the pull-down power line SB.

The pull-up driving unit 220 supplies the power supply voltage VDD being the overdriving voltage to the pull-up power line RTO when the pull-up driving signal SAP1 is enabled during an overdriving period. Such a pull-up driving unit 220 may include, for example but not limited to, an NMOS transistor N4. The NMOS transistor N4 may be coupled between the application terminal of the power supply voltage VDD and the pull-up power line RTO, and may be applied with the pull-up driving signal SAP1 through the gate terminal thereof.

The pull-up driving unit 230 supplies the core voltage VCORE to the pull-up power line RTO when the pull-up driving signal SAP2 is enabled during an active period. Such a pull-up driving unit 230 may include, for example but not limited to, an NMOS transistor N5. The NMOS transistor N5 may be coupled between the application terminal of the core voltage VCORE and the pull-up power line RTO, and may be applied with the pull-up driving signal SAP2 through the gate terminal thereof.

The pull-up driving unit 240 supplies the POD voltage VDD_POD to the pull-up power line RTO when the pull-up driving signal SAP3 is enabled during the post overdriving period. Such a pull-up driving unit 240 may include, for example but not limited to, an NMOS transistor N6. The NMOS transistor N6 may be coupled between the application terminal of the POD voltage VDD_POD and the pull-up power line RTO, and may be applied with the pull-up driving signal SAP3 through the gate terminal thereof.

The pull-down driving unit 250 supplies the ground voltage VSS to the pull-down power line SB when the pull-down driving signal SAN is enabled during the active period. Such a pull-down driving unit 250 may include, for example but not limited to, an NMOS transistor N7. The NMOS transistor N7 may be coupled between the application terminal of the ground voltage VSS and the pull-down power line SB, and may be applied with the pull-down driving signal SAN through the gate terminal thereof.

Figure 4:
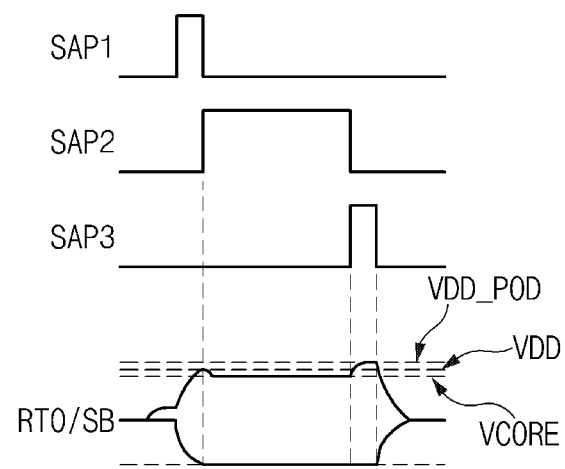
FIG. 4 is a representation of an example of an operation waveform diagram for the sense amplifier driving block illustrated in FIG. 3.

FIG. 4 is a representation of an example of an operation waveform diagram for the sense amplifier driving block 200 illustrated in FIG. 3.

If the pull-up driving signal SAP1 is enabled in the overdriving operation mode, the pull-up driving unit 220 operates. During the overdriving operation period, the power supply voltage VDD is applied to the pull-up power line RTO.

If the pull-up driving signal SAP2 is enabled in the normal active operation mode, the pull-up driving unit 230 operates. During the normal operation period, the core voltage VCORE is applied to the pull-up power line RTO.

If the pull-up driving signal SAP3 is enabled in the post overdriving operation mode, the pull-up driving unit 240 operates. During the POD operation period, the POD voltage VDD_POD higher than the power supply voltage VDD is applied to the pull-up power line RTO.

Figure 5:
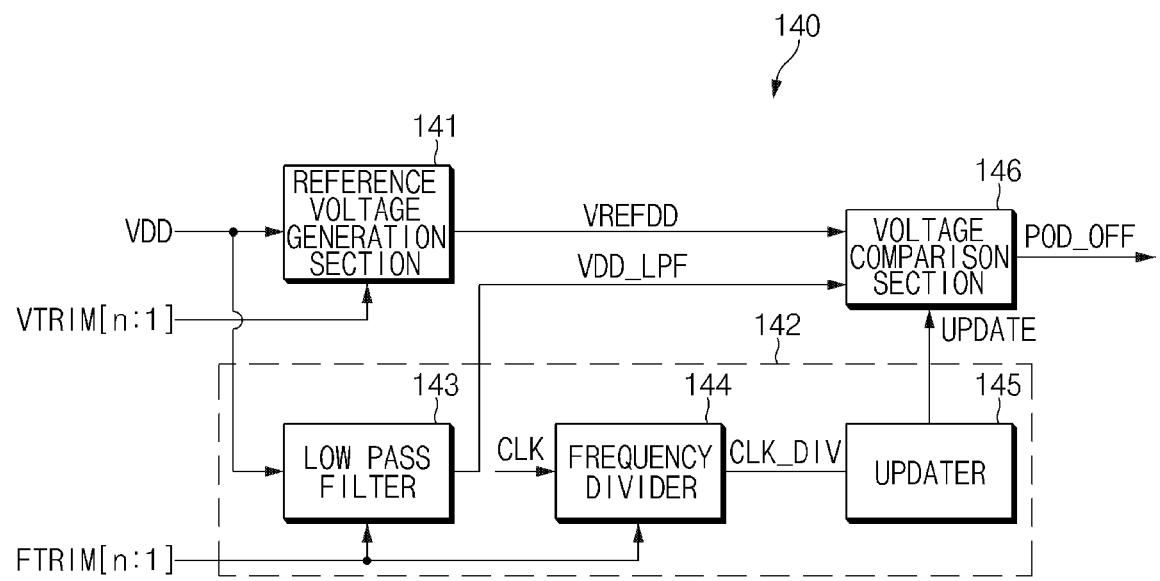
FIG. 5 is a detailed configuration diagram illustrating a representation of an example of the post overdriving control unit illustrated in FIG. 2.

FIG. 5 is a configuration diagram illustrating a representation of an example of the post overdriving control unit 140 illustrated in FIG. 2.

The post overdriving control unit 140 may include a reference voltage generation section 141, a power noise removal section 142, and a voltage comparison section 146.

The reference voltage generation section 141 outputs a reference voltage VREFDD to the voltage comparison section 146 in correspondence to the power supply voltage VDD and the voltage trimming signal VTRIM. The reference voltage generation section 141 may trim the level of the reference voltage VREFDD within a specified range by the voltage trimming signal VTRIM[n:1]. For example, the reference voltage generation section 141 may change the reference voltage VREFDD through the voltage trimming signal VTRIM[n:1] from an exterior to set the power supply voltage VDD for applying POD, to an optimal value.

The power noise removal section 142 outputs a filtered power supply voltage VDD_LPF and an update signal UPDATE to the voltage comparison section 146 in correspondence to the power supply voltage VDD, the frequency trimming signal FTRIM and the clock CLK.

Such a power noise removal section 142 may include a low pass filter 143, a frequency divider 144, and an updater 145.

The low pass filter 143 removes noise from the level of the power supply voltage VDD, and generates the filtered power supply voltage VDD_LPF. For example, the low pass filter 143 removes a momentarily changing characteristic from the power supply voltage VDD, and attenuates the power supply voltage VDD to a voltage waveform with a gentle change. The low pass filter 143 may trim the time-dependent change characteristic (the frequency characteristic) of the filtered power supply voltage VDD_LPF within a specified range by the frequency trimming signal FTRIM[n:1]. The frequency trimming signal FTRIM[n:1] may be a signal for determining the frequency characteristic of the power noise removal section 142.

The frequency divider 144 frequency-divides the clock CLK, and outputs a divided clock CLK_DIV to the updater 145. In the example where the time-dependent change of the filtered power supply voltage VDD_LPF is fast, a clock frequency may be controlled to be fast, by controlling the divided clock CLK_DIV. Conversely, in the example where the time-dependent change of the filtered power supply voltage VDD_LPF is slow, a clock frequency may be controlled to be slow, by controlling the divided clock CLK_DIV, and thus, power consumption may be reduced.

The frequency divider 144 may trim the divided clock CLK_DIV within a specified range by the frequency trimming signal FTRIM[n:1]. For example, the frequency divider 144 may change the frequency of the divided clock CLK_DIV through the frequency trimming signal FTRIM[n:1] from the exterior to set the clock CLK for applying POD, to an optimal value.

The updater 145 outputs the update signal UPDATE for controlling the voltage comparison section 146 in synchronization with the divided clock CLK_DIV, to the voltage comparison section 146. For example, the updater 145 generates the update signal UPDATE for updating whether to perform the POD operation, as a pulse signal, and outputs the generated pulse signal to the voltage comparison section 146.

The voltage comparison section 146 compares and latches the reference voltage VREFDD and the filtered power supply voltage VDD_LPF, and outputs the POD control signal POD_OFF. The voltage comparison section 146 updates whether to perform the POD operation, during only a period in which the update signal UPDATE is a high level, such that an unnecessary update operation is not performed.

For example, the voltage comparison section 146 enables the POD control signal POD_OFF in the example where the filtered power supply voltage VDD_LPF is a level higher than the reference voltage VREFDD. Conversely, the voltage comparison section 146 disables the POD control signal POD_OFF in the example where the filtered power supply voltage VDD_LPF is a level lower than the reference voltage VREFDD. The voltage comparison section 146 controls the output of the POD control signal POD_OFF in synchronization with the clock of the update signal UPDATE.

Figure 6:
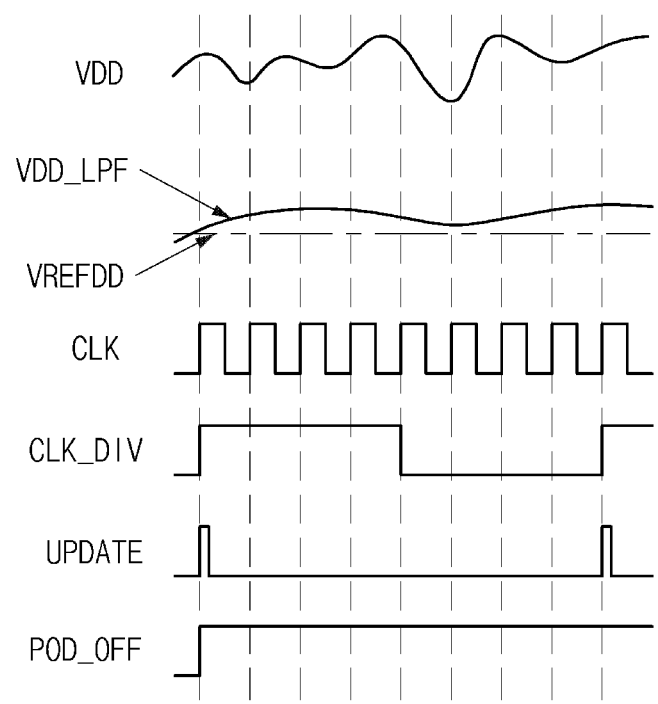
FIG. 6 is a representation of an example of an operation waveform diagram for the post overdriving control unit illustrated in FIG. 5.

An operation process for the post overdriving control unit 140 of FIG. 5 having an above-described configuration will be described below with reference to the operation waveform diagram of FIG. 6.

The reference voltage generation section 141 generates the reference voltage VREFDD in correspondence to the power supply voltage VDD, and outputs the reference voltage VREFDD to the voltage comparison section 146. The low pass filter 143 removes noise from the power supply voltage VDD, and outputs the filtered power supply voltage VDD_LPF to the voltage comparison section 146.

The frequency divider 144 frequency-divides the clock CLK, generates the divided clock CLK_DIV with a specified cycle, and outputs the divided clock CLK_DIV to the updater 145. The frequency divider 144 may output the divided clock CLK_DIV by dividing the clock CLK by the unit of 4 clocks or by the unit of 8 clocks, and a division unit is not specifically limited. The updater 145 generates a pulse signal enabled to a high level for a specified period from a point of time at which the divided clock CLK_DIV transitions to a high level, as the update signal UPDATE.

The voltage comparison section 146 compares the reference voltage VREFDD and the filtered power supply voltage VDD_LPF during a pulse period in which the update signal UPDATE is the high level, and controls the enable state of the POD control signal POD_OFF. The voltage comparison section 146 latches the POD control signal POD_OFF until another update signal UPDATE is enabled to the high level.

For example, the voltage comparison section 146 outputs the POD control signal POD_OFF to a high level in the example where the filtered power supply voltage VDD_LPF is a level higher than the reference voltage VREFDD during the pulse period in which the update signal UPDATE is the high level. In the example where the filtered power supply voltage VDD_LPF is a level higher than the reference voltage VREFDD, since it is meant that the power supply voltage VDD is raised to a targeted high voltage level, it is not necessary to perform the post overdriving (POD) operation.

In the example where the POD control signal POD_OFF is the high level, the output of the inverter IV1 becomes the low level. Then, the combination unit 160 disables the pull-up driving signal SAP3 regardless of the level of the driving signal SAP3_PRE. In this example, the pull-up driving unit 240 is turned off, and the POD voltage VDD_POD is not supplied to the pull-up power line RTO even during the post overdriving (POD) period. According to this fact, the post overdriving operation is not performed in the state in which the level of the power supply voltage VDD is sufficiently high, whereby it may be possible to reduce unnecessary power consumption.

Figure 7:
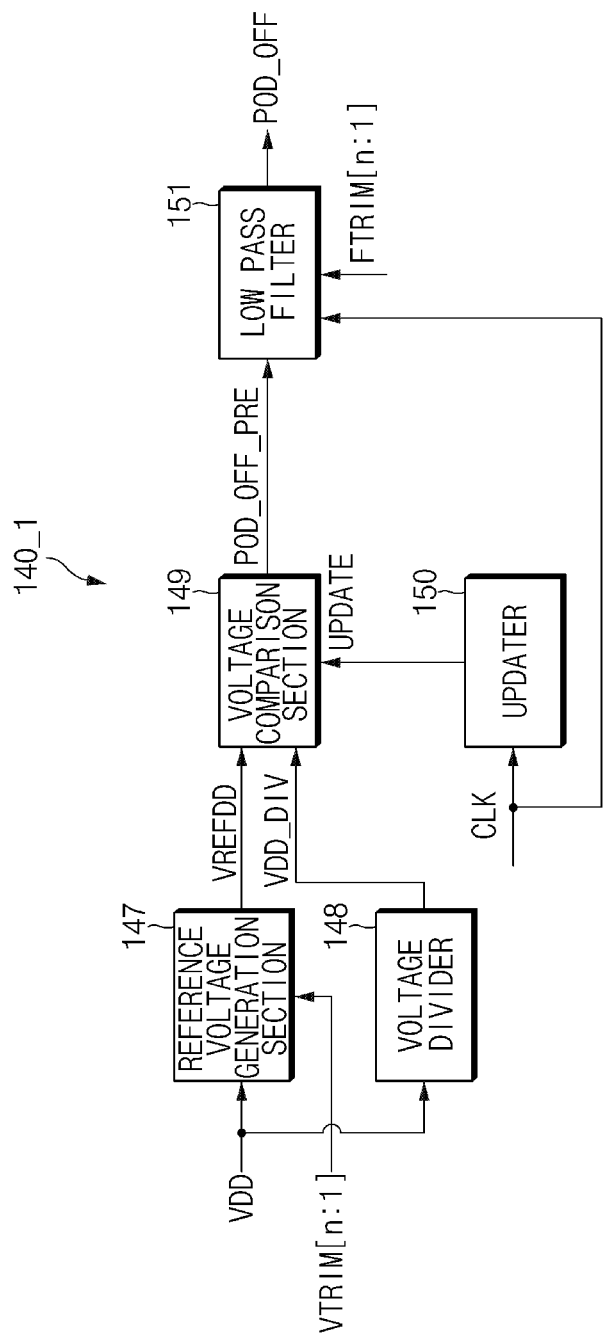
FIG. 7 is a configuration diagram illustrating a representation of an example of the post overdriving control unit illustrated in FIG. 2.

FIG. 7 is a configuration diagram illustrating a representation of an example of the post overdriving control unit 140_1 illustrated in FIG. 2.

The post overdriving control unit 140_1 may include a reference voltage generation section 147, a voltage divider 148, and a voltage comparison section 149. The post overdriving control unit 140_1 may include an updater 150, and a low pass filter 151. The low pass filter 143 of FIG. 5 may be generally realized by a resistor and a capacitor in an embodiment. A low pass filter 143 configured with a capacitor and a resistor occupies a relatively large area. To decrease the area occupied by a low pass filter configured with a capacitor and a resistor a digital low pass filter may be used in an embodiment. For example, the low pass filter 151 as illustrated in FIG. 7 may be digitally realized in an embodiment.

The reference voltage generation section 147 outputs a reference voltage VREFDD to the voltage comparison section 149 in correspondence to the power supply voltage VDD and the voltage trimming signal VTRIM. The reference voltage generation section 147 may trim the level of the reference voltage VREFDD within a specified range by the voltage trimming signal VTRIM[n:1]. For example, the reference voltage generation section 147 may change the reference voltage VREFDD through the voltage trimming signal VTRIM[n:1] from an exterior to set the power supply voltage VDD for applying POD, to an optimal value. The voltage divider 148 divides the power supply voltage VDD, and outputs a divided voltage VDD_DIV to the voltage comparison section 149.

The voltage comparison section 149 compares the reference voltage VREFDD and the divided voltage VDD_DIV, and outputs a control signal POD_OFF_PRE. The voltage comparison section 149 updates whether to perform the POD operation, during only a period in which an update signal UPDATE is a high level, such that an unnecessary update operation is not performed.

For example, the voltage comparison section 149 may enable the control signal POD_OFF_PRE in the example where the divided voltage VDD_DIV is a level higher than the reference voltage VREFDD. Conversely, the voltage comparison section 149 may disable the control signal POD_OFF_PRE in the example where the divided voltage VDD_DIV is a level lower than the reference voltage VREFDD. The voltage comparison section 149 controls the output of the control signal POD_OFF_PRE in synchronization with the clock of the update signal UPDATE.

The updater 150 outputs the update signal UPDATE to the voltage comparison section 149. The updater 150 may output the update signal UPDATE for controlling the voltage comparison section 149 in synchronization with the clock CLK. For example, the updater 150 generates the update signal UPDATE for updating whether to perform the POD operation, as a pulse signal, and outputs the generated pulse signal to the voltage comparison section 149.

The low pass filter 151 may remove noise from the control signal POD_OFF_PRE, and generate a filtered POD control signal POD_OFF. The low pass filter 151 may trim the level of the POD control signal POD_OFF within a specified range by the frequency trimming signal FTRIM[n:1]. For example, the low pass filter 151 may change the frequency of the POD control signal POD_OFF through the frequency trimming signal FTRIM[n:1] from the exterior to set the clock CLK for applying POD, to an optimal value.

An example of an operation process for the post overdriving control unit 140_1 of FIG. 7 having an above-described configuration will be described below with reference to the operation waveform diagram of FIG. 8.

The reference voltage generation section 147 generates the reference voltage VREFDD in correspondence to the power supply voltage VDD, and outputs the reference voltage VREFDD to the voltage comparison section 149. The voltage divider 148 divides the power supply voltage VDD, and outputs the divided voltage VDD_DIV to the voltage comparison section 149.

The updater 150 generates a pulse signal enabled to a high level for a specified period from a point of time at which the clock CLK transitions to a high level, as the update signal UPDATE, and outputs the update signal UPDATE to the voltage comparison section 149.

The voltage comparison section 149 compares the reference voltage VREFDD and the divided voltage VDD_DIV during a pulse period in which the update signal UPDATE is the high level, and outputs the control signal POD_OFF_PRE to the low pass filter 151.

For example, the voltage comparison section 149 outputs the control signal POD_OFF_PRE to a high level in the example where the divided voltage VDD_DIV is a level higher than the reference voltage VREFDD during the pulse period in which the update signal UPDATE is the high level. The voltage comparison section 149 latches the control signal POD_OFF_PRE until another update signal UPDATE is enabled to the high level. In the example where the divided voltage VDD_DIV is a level higher than the reference voltage VREFDD, since it is meant that the power supply voltage VDD is raised to a targeted high voltage level, it is not necessary to perform the post overdriving (POD) operation.

Conversely, the voltage comparison section 149 outputs the control signal POD_OFF_PRE to a low level in the example where the divided voltage VDD_DIV is a level lower than the reference voltage VREFDD during the pulse period in which the update signal UPDATE is the high level. In the example where the divided voltage VDD_DIV is a level lower than the reference voltage VREFDD, since it is meant that the power supply voltage VDD is a low voltage level, it is necessary to perform the post overdriving (POD) operation.

The low pass filter 151 removes noise from the control signal POD_OFF_PRE, and outputs the filtered POD control signal POD_OFF. In an embodiment, the low pass filter 151 may control the logic state of the POD control signal POD_OFF by digitally filtering the control signal POD_OFF_PRE. Further, in the example where the low pass filter 151 is realized as a digital filter, the area of the filter may be decreased.

For example, by accumulating the number of the logic "1" states of the control signal POD_OFF_PRE during N clock cycles (for example, N=4, however N may be any integer greater than zero), the logic state of the POD control signal POD_OFF may be controlled. If the number of the logic "1" states of the control signal POD_OFF_PRE is larger than N/2, the POD control signal POD_OFF is outputted to a high level. Conversely, if the number of the logic "1" states of the control signal POD_OFF_PRE is smaller than or equal to N/2, the POD control signal POD_OFF is outputted to a low level.

Figure 8:
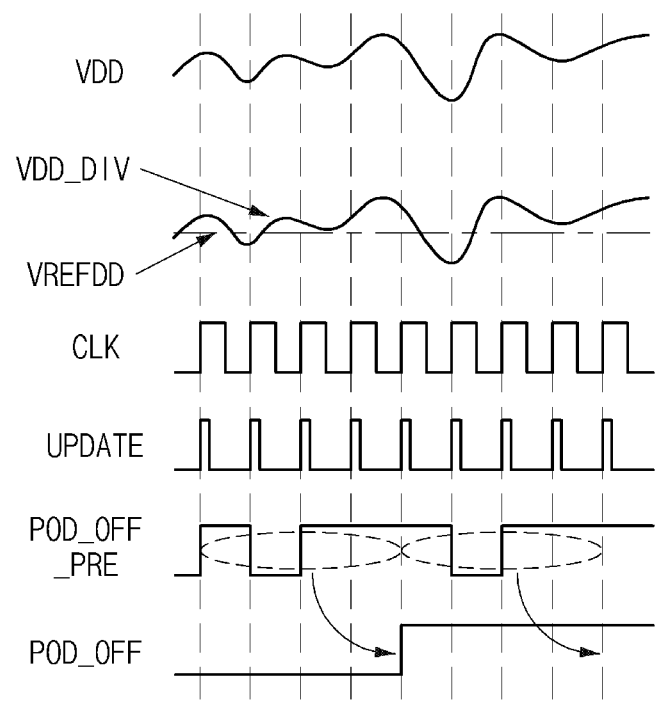
FIG. 8 is a representation of an example of an operation waveform diagram for the post overdriving control unit illustrated in FIG. 7.

In the timing diagram of FIG. 8, since the number of the logic "1" states of the control signal POD_OFF_PRE is "3" and is larger than N/2 (for example, N=4, however N may be any integer greater than zero), the POD control signal POD_OFF is outputted to the high level such that the post overdriving operation is not performed.

In other words, in the example where the filtered POD control signal POD_OFF is the high level, the output of the inverter IV1 becomes the low level. Then, the combination unit 160 disables the pull-up driving signal SAP3 regardless of the level of the driving signal SAP3_PRE. In this example, the pull-up driving unit 240 is turned off, and the POD voltage VDD_POD is not supplied to the pull-up power line RTO even during the post overdriving (POD) period. According to this fact, the post overdriving operation is not performed in the state in which the level of the power supply voltage VDD is sufficiently high, whereby it may be possible to reduce unnecessary power consumption.

Figure 9:
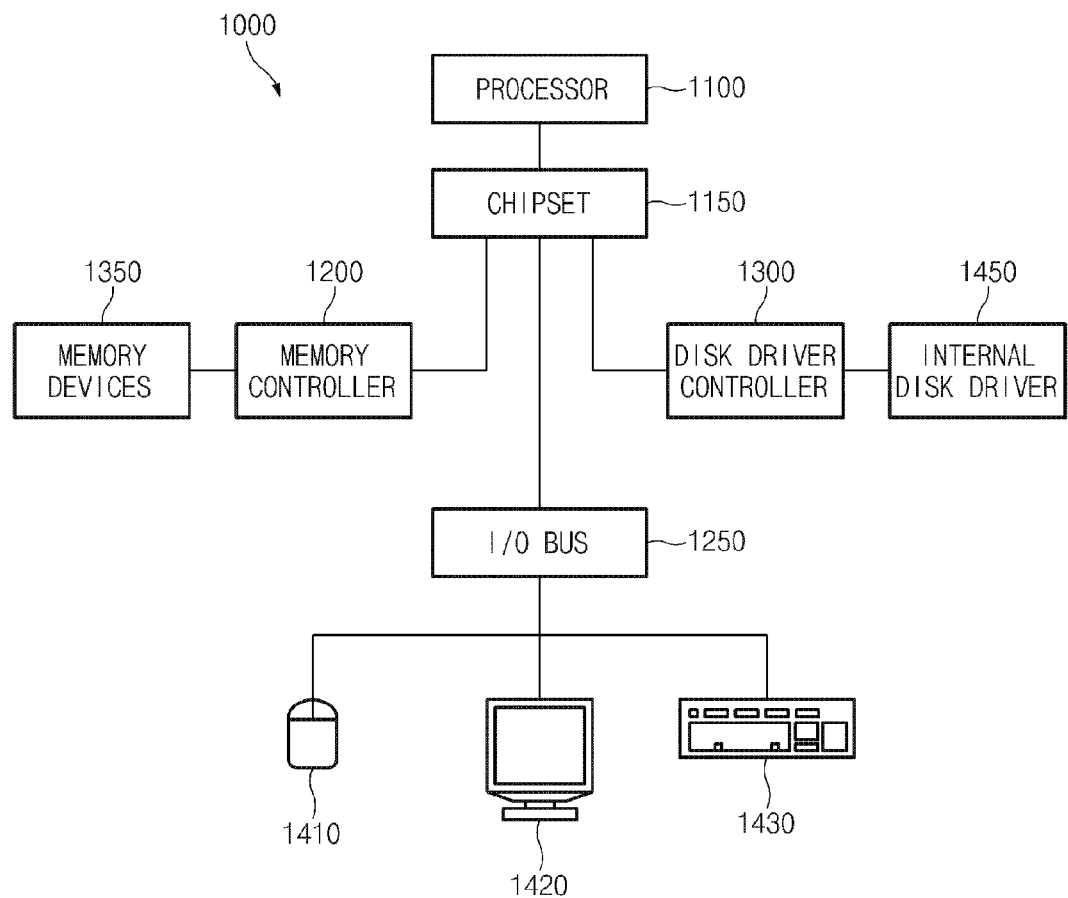
FIG. 9 illustrates a block diagram of an example of a representation of a system employing a sense amplifier driving device and/or semiconductor device in accordance with the various embodiments discussed above with relation to FIGS. 1-8.

The semiconductor devices and/or sense amplifier driving devices discussed above (see FIGS. 1-8) are particular useful in the design of memory devices, processors, and computer systems. For example, referring to FIG. 9, a block diagram of a system employing a semiconductor device and/or a sense amplifier driving device in accordance with the various embodiments are illustrated and generally designated by a reference numeral 1000. The system 1000 may include one or more processors (i.e. Processor) or central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system may include a memory controller 1200, an input/output ("I/O") bus 1250, and a disk driver controller 1300. Depending on the configuration of a system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device and/or sense amplifier driving device as discussed above with reference to FIGS. 1-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or sense amplifier driving device as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420 and 1430 may include, for example but not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a system employing a semiconductor device and/or sense amplifier driving device as discussed above with relation to FIGS. 1-8. In alternate embodiments, such as cellular phones or digital cameras, the components may differ from the embodiments illustrated in FIG. 9.

Various embodiments have been described. For reference, embodiments including additional component elements, which are not directly associated with the technical spirit of the description, may be exemplified in order to further describe the concepts. Moreover, an active high configuration or an active low configuration for indicating the activated states of signals and circuits may vary depending upon an embodiment. The configurations of transistors may be changed as the occasion demands in order to realize the same function. For example, the configurations of a PMOS transistor and an NMOS transistor may be replaced with each other, and as the occasion demands, various transistors may be employed. Since these circuit changes have a large number of examples and can be easily inferred by those skilled in the art, the enumeration thereof will be omitted herein.

While various embodiments have been described above, it will be understood to those skilled in the art that the embodiments described are by way of example only. Accordingly, the sense amplifier driving devices and the semiconductor devices including the same described herein should not be limited based on the described embodiments.

What is claimed is:

1. A sense amplifier driving device comprising:
   a sense amplifier driving block configured to supply a post overdriving voltage to a pull-up power line coupled to a sense amplifier, the post overdriving voltage supplied to the sense amplifier during a post overdriving operation period in correspondence to a pull-up driving signal; and
   a driving signal generation block configured to compare a reference voltage, set by a voltage trimming signal, with a level of a power supply voltage, and generate the pull-up driving signal for controlling whether to perform a post overdriving operation.

2. The sense amplifier driving device according to claim 1, wherein the driving signal generation block comprises:
   a post overdriving driving signal generation unit configured to generate a driving signal for controlling the post overdriving operation;
   a post overdriving control unit configured to compare the level of the power supply voltage with the reference voltage, and generate a post overdriving control signal for controlling whether to perform the post overdriving operation; and
   a combination unit configured to combine the driving signal and the post overdriving control signal, and output the pull-up driving signal.

3. The sense amplifier driving device according to claim 2, wherein the post overdriving control unit comprises:
   a reference voltage generation section configured to trim the power supply voltage in accordance with the voltage trimming signal, and generate the reference voltage;
   a power noise removal section configured to generate a filtered power supply voltage by filtering the power supply voltage, and output an update signal for updating the post overdriving operation in correspondence to a clock; and
   a voltage comparison section configured to compare the reference voltage with the filtered power supply voltage when the update signal is enabled, and output the post overdriving control signal.

4. The sense amplifier driving device according to claim 3, wherein the power noise removal section comprises:
   a low pass filter configured to filter the power supply voltage, and output the filtered power supply voltage;
   a frequency divider configured to frequency-divide the clock, and generate a divided clock; and
   an updater configured to output the update signal having a specified pulse period, in correspondence to the divided clock.

5. The sense amplifier driving device according to claim 4, wherein the update signal is a signal enabled to a high level during the specified pulse period from a point of time at which the divided clock transitions to a high level.

6. The sense amplifier driving device according to claim 4,
   wherein the low pass filter trims a time-dependent change characteristic of the filtered power supply voltage in accordance with a frequency trimming signal, and
   wherein the frequency divider trims a time-dependent change characteristic of the divided clock in accordance with the frequency trimming signal.

7. The sense amplifier driving device according to claim 3, wherein the voltage comparison section latches and outputs the post overdriving control signal to a high level when the filtered power supply voltage is higher than the reference voltage during an enable period of the update signal.

8. The sense amplifier driving device according to claim 2, wherein the post overdriving control unit comprises:
   a reference voltage generation section configured to trim the power supply voltage in accordance with the voltage trimming signal, and generate the reference voltage;
   a voltage divider configured to divide the power supply voltage, and output a divided voltage;
   an updater configured to output an update signal having a specified pulse period, in correspondence to a clock;
   a voltage comparison section configured to compare the reference voltage and the divided voltage when the update signal is enabled, and output a control signal; and
   a low pass filter configured to filter the control signal, and output the post overdriving control signal, wherein the low pass filter trims a level of the post overdriving control signal in accordance with a frequency trimming signal.

9. The sense amplifier driving device according to claim 8, wherein the update signal is a signal enabled to a high level during the specified pulse period from a point of time at which the clock transitions to a high level.

10. The sense amplifier driving device according to claim 8,
    wherein the low pass filter controls a logic state of the post overdriving control signal by accumulating the number of logic "1" states of the control signal during N clock cycles,
    wherein N is an integer greater than zero.

11. The sense amplifier driving device according to claim 10,
    wherein the low pass filter outputs the post overdriving control signal to the high level when the number of the logic "1" states of the control signal is larger than N/2, wherein N/2 is a number of clock cycles divided by two, and wherein the low pass filter outputs the post overdriving control signal to a low level when the number of the logic "1" states of the control signal is less than or equal to N/2.

12. The sense amplifier driving device according to claim 2, wherein the combination unit outputs the pull-up driving signal to a low level when at least any one of the driving signal and an inverted signal of the post overdriving control signal is a low level.

13. The sense amplifier driving device according to claim 1, wherein the post overdriving voltage has a level higher than the power supply voltage.

14. The sense amplifier driving device according to claim 1,
wherein the sense amplifier driving block comprises a pull-up driving unit driven by the pull-up driving signal and supplies the post overdriving voltage to the pull-up power line, and
wherein, when the level of the power supply voltage is higher than the reference voltage, the pull-up driving signal is disabled, and supply of the post overdriving voltage is interrupted.

15. The sense amplifier driving device according to claim 1, wherein the sense amplifier driving block further comprises:
a precharge driving unit configured to precharge the pull-up power line and a pull-down power line of the sense amplifier;
a first pull-up driving unit configured to supply the power supply voltage to the pull-up power line in correspondence to a first pull-up driving signal during an overdriving period;
a second pull-up driving unit configured to supply a core voltage to the pull-up power line in correspondence to a second pull-up driving signal during a normal operation period; and
a pull-down driving unit configured to supply a ground voltage to the pull-down power line in correspondence to a pull-down driving signal.

16. The sense amplifier driving device according to claim 2, wherein the driving signal generation block further comprises:
a power driving signal generation unit configured to generate another pull-up driving signal for controlling a normal operation;
a post overdriving driving signal generation unit configured to generate a driving signal for controlling the post overdriving operation; and
a driving signal generation unit configured to generate a pull-down driving signal for controlling the normal operation.

17. A semiconductor device comprising:
a sense amplifier configured to sense and amplify data according to a voltage applied to a pull-up power line and a pull-down power line; and
a sense amplifier driving device configured to compare a reference voltage, set by a voltage trimming signal, with a level of a power supply voltage, generate a pull-up driving signal for controlling whether to perform a post overdriving operation, and selectively supply a post overdriving voltage to the pull-up power line during a post overdriving operation period in correspondence to the pull-up driving signal.

18. The semiconductor device according to claim 17, wherein, in the sense amplifier driving device, the pull-up driving signal is disabled when the level of the power supply voltage is higher than the reference voltage, and supply of the post overdriving voltage is interrupted.

19. The semiconductor device according to claim 18, wherein the sense amplifier driving device comprises:
a reference voltage generation section configured to trim the power supply voltage in accordance with the voltage trimming signal, and generate the reference voltage;
a low pass filter configured to filter the power supply voltage, and output a filtered power supply voltage;
a frequency divider configured to frequency-divide a clock, and generate a divided clock;
an updater configured to output an update signal having a specified pulse period, in correspondence to the divided clock; and
a voltage comparison section configured to compare the reference voltage and the filtered power supply voltage when the update signal is enabled, and output a post overdriving control signal for controlling the pull-up driving signal.

20. The semiconductor device according to claim 18, wherein the sense amplifier driving device comprises:
a reference voltage generation section configured to trim the power supply voltage in accordance with the voltage trimming signal, and generate the reference voltage;
a voltage divider configured to divide the power supply voltage, and output a divided voltage;
an updater configured to output an update signal having a specified pulse period, in correspondence to a clock;
a voltage comparison section configured to compare the reference voltage and the divided voltage when the update signal is enabled, and output a control signal; and
a low pass filter configured to filter the control signal, and output a post overdriving control signal for controlling the pull-up driving signal.

* * * * *